(12) United States Patent
Jenne et al.

(10) Patent No.: US 7,082,053 B1
(45) Date of Patent: Jul. 25, 2006

(54) NON-VOLATILE LATCH WITH MAGNETIC JUNCTIONS

(75) Inventors: Fredrick L. Jenne, Los Gatos, CA (US); Gary A. Gibbs, San Jose, CA (US)

(73) Assignee: Silicon Magnetic Systems, San Jose, CA (US)

( * ) Notice: Subject to any disclaimer, the term of this patent is extended or adjusted under 35 U.S.C. 154(b) by 223 days.

(21) Appl. No.: 10/745,725

(22) Filed: Dec. 24, 2003

(51) Int. Cl.
*G11C 11/15* (2006.01)

(52) U.S. Cl. .................. 365/173; 365/225.5; 365/158; 365/189.05

(58) Field of Classification Search ................ 365/173, 365/225.5, 158, 189.05, 50
See application file for complete search history.

(56) References Cited

U.S. PATENT DOCUMENTS

| | | | |
|---|---|---|---|
| 6,147,922 A | 11/2000 | Hurst, Jr. et al. | |
| 6,175,525 B1 * | 1/2001 | Fulkerson et al. | 365/189.05 |
| 6,178,111 B1 * | 1/2001 | Sather et al. | 365/158 |
| 6,542,000 B1 * | 4/2003 | Black et al. | 326/39 |
| 6,914,845 B1 * | 7/2005 | Ooishi | 365/229 |

FOREIGN PATENT DOCUMENTS

| | | |
|---|---|---|
| DE | 102 11 337 | 10/2003 |
| WO | 80/01965 | 9/1980 |

OTHER PUBLICATIONS

International Search Report, PCT/US2004/042559, mailed Apr. 6, 2005.

* cited by examiner

*Primary Examiner*—Tuan T. Nguyen
*Assistant Examiner*—Toan Le
(74) *Attorney, Agent, or Firm*—Kevin L. Daffer; Mollie E. Lettang; Daffer McDaniel, LLP

(57) ABSTRACT

A memory storage circuit is provided which includes a plurality of magnetic elements each configured to store bits in a first or a second logic state. The storage circuit may further include a plurality of transistors coupled to at least two of the magnetic elements. Such a plurality of transistors may be collectively configured to store bits in the first and second logic states as well. The memory storage circuit may include circuitry configured to load bits from a set of the magnetic elements into the plurality of transistors. Another circuit is provided which includes a magnetic element interposed between a bit line and an electrode. The circuit may further include a first set of circuitry configured to induce current flow through the magnetic element in a direction from the electrode to the bit line. A method for operating a memory storage circuit with the aforementioned configurations is also provided.

15 Claims, 4 Drawing Sheets

NON-VOLATILE LATCH WITH MAGNETIC JUNCTIONS

BACKGROUND OF THE INVENTION

1. Field of the Invention

This invention relates to memory storage circuits and, more particularly, to non-volatile latches.

2. Description of the Related Art

The following descriptions and examples are given as background information only.

A latch may generally refer to any microelectronic device that can store information. In many cases, a latch may be configured to produce complementary outputs that are stable in one of two logic states. The complementary outputs are oftentimes referred to as differential outputs, in that while one output is at one logic state, the other output is at the second logic state. The outputs can be referenced as a "true," "on," "high," or "1" logic level and as a "false," "off," "low," or "0" logic level. In some cases, latches are configured as volatile circuits in that they lose data in the absence of power. In other cases, however, latches may be configured as nonvolatile circuits in that they can retain stored data in the absence of power. In some cases, volatile circuits may provide a more rapid response than conventional nonvolatile circuits and, therefore, may provide faster read times.

Volatile latches, however, often require relatively high voltages for operation, such as on the order of more than approximately 15 volts. Some conventional nonvolatile latches may necessitate slightly lower voltages for operation, such as between approximately 8 volts and approximately 12 volts. Such a range of voltage levels may still be undesirably high in some cases, particularly as the drive to produce microelectronic devices that can process larger amounts of information continues and microelectronic devices are scaled down to smaller sizes making high voltage programming more difficult. In addition, conventional nonvolatile latches may require relatively long programming times, such as 10 ms, for example. Such relatively long programming times may undesirably limit the progress of producing devices which can process information quickly, which is commonly a high priority objective in the design of microelectronic devices.

It would, therefore, be advantageous to develop a latch which can be programmed in a relatively small amount of time and/or operate at a relatively low voltage, particularly in comparison to conventional latches. It would be further beneficial for such a latch to be nonvolatile such that data may be stored therein when power is terminated from the circuit. Furthermore, it would be advantageous to create a nonvolatile latch with relatively fast program and read times, particularly in reference to conventional volatile latches.

SUMMARY OF THE INVENTION

The problems outlined above may be in large part addressed by a memory storage circuit with a non-volatile portion comprising a plurality of magnetic elements and a volatile portion comprising a plurality of transistors. In general, the plurality of magnetic elements may each be configured to store nonvolatile bits in a first logic state or a second logic state and the plurality of transistors may be collectively configured to store bits in the first and second logic states. In general, the memory storage circuit may be configured to load data into the set of magnetic elements from an external source and/or from the plurality of transistors. In some embodiments, the memory storage circuit may include a pair of NAND gates respectively coupled to a set of the magnetic elements such that data may be loaded from the plurality of transistors. In any case, the set of magnetic elements may include a differential pair of magnetic elements in some cases. In other embodiments, the nonvolatile portion of the memory storage circuit may include a selected magnetic element which is used in conjunction with a plurality of reference magnetic elements arranged external to the nonvolatile portion.

In general, the memory storage circuit may include circuitry configured to load bits from a set of the magnetic elements into the plurality of transistors. In particular, the circuitry may include a first set of structures configured to pass current through the set of magnetic elements. Such a first set of conductive structures may include a bit line and an electrode coupled to opposing sides of each of the set of magnetic elements. In some cases, the circuitry may be configured to induce current flow through each of the magnetic elements in a direction from the electrode to the bit line. In such an embodiment, the set of magnetic elements may be coupled to a common program current source.

In some embodiments, the memory storage circuit may further include a second set of conductive structures configured to induce magnetic fields about the set of the magnetic elements. In some cases, the second set of conductive structures may include a first series of connected conductive structures comprising at least two elements respectively aligned with opposing sides of one of set of magnetic elements. In addition, the second set of conductive structures may include a second series of connected conductive structures comprising at least two elements respectively aligned with opposing sides of the other of the set of magnetic elements. In such an embodiment, the first and second series of connected conductive structures may be arranged such that first and second logic states may be programmed into the set of magnetic elements, respectively. In some cases, the memory storage circuit may include a subcircuit configured to alter current applications along at least one of the first and second sets of conductive structures. In addition or alternatively, the memory storage circuit may include a program transistor coupled between the set of magnetic elements and configured to enable current flow through the first set of conductive structures.

In some embodiments, the circuitry used to load bits from the set of the magnetic elements into the plurality of transistors may be substantially absent of cross-over lines. In other words, the circuitry may include distinct lines which do not overlap within the topography of the microelectronic device such that the nodes of the plurality of transistors may be loaded with logic states that directly correspond to the logic states stored within the magnetic cell junctions coupled thereto. Consequently, a method for operating a latch is provided herein. In particular, the method may include charging up first and second nodes within a volatile portion of the latch wherein the first and second nodes are respectively arranged at opposing ends of the volatile portion. In addition, the method may include inducing current flow through two magnetic elements respectively arranged within first and second regions of a non-volatile portion of the latch, wherein the first and second regions are respectively arranged in alignment with the opposing ends of the volatile portion. The method may further include loading the first and second nodes to have logic states which correspond to resistance levels within the magnetic elements in the first and second regions, respectively. In some cases, the step of loading may include discharging the first and second nodes at different rates. More specifically, the step of loading may include discharging the first and second nodes until the second node reaches a threshold voltage of a transistor coupled thereto such that the second node is pulled low and the first node is pulled high.

There may be several advantages for providing the nonvolatile latch described herein. In particular, the inclusion of magnetic elements may allow the nonvolatile latch to operate at relatively low voltages, such as less than approximately 2 volts, for example. As a result, the overall power requirements of the nonvolatile latch provided herein may be less than latches which do not include magnetic elements. In addition, programming the nonvolatile latch may be conducted in approximately 20 ns, resulting in a device having a faster operational speed than a device comprising a latch which does not include magnetic elements. In addition, the latch provided herein may retain data for more than approximately 10 years. Furthermore, the latch described herein may be expected to endure more than $10^{15}$ programming cycles before failing, increasing the reliability of the device relative to latches which do not include magnetic elements.

BRIEF DESCRIPTION OF THE DRAWINGS

Other objects and advantages of the invention will become apparent upon reading the following detailed description and upon reference to the accompanying drawings in which.

Figure 1:
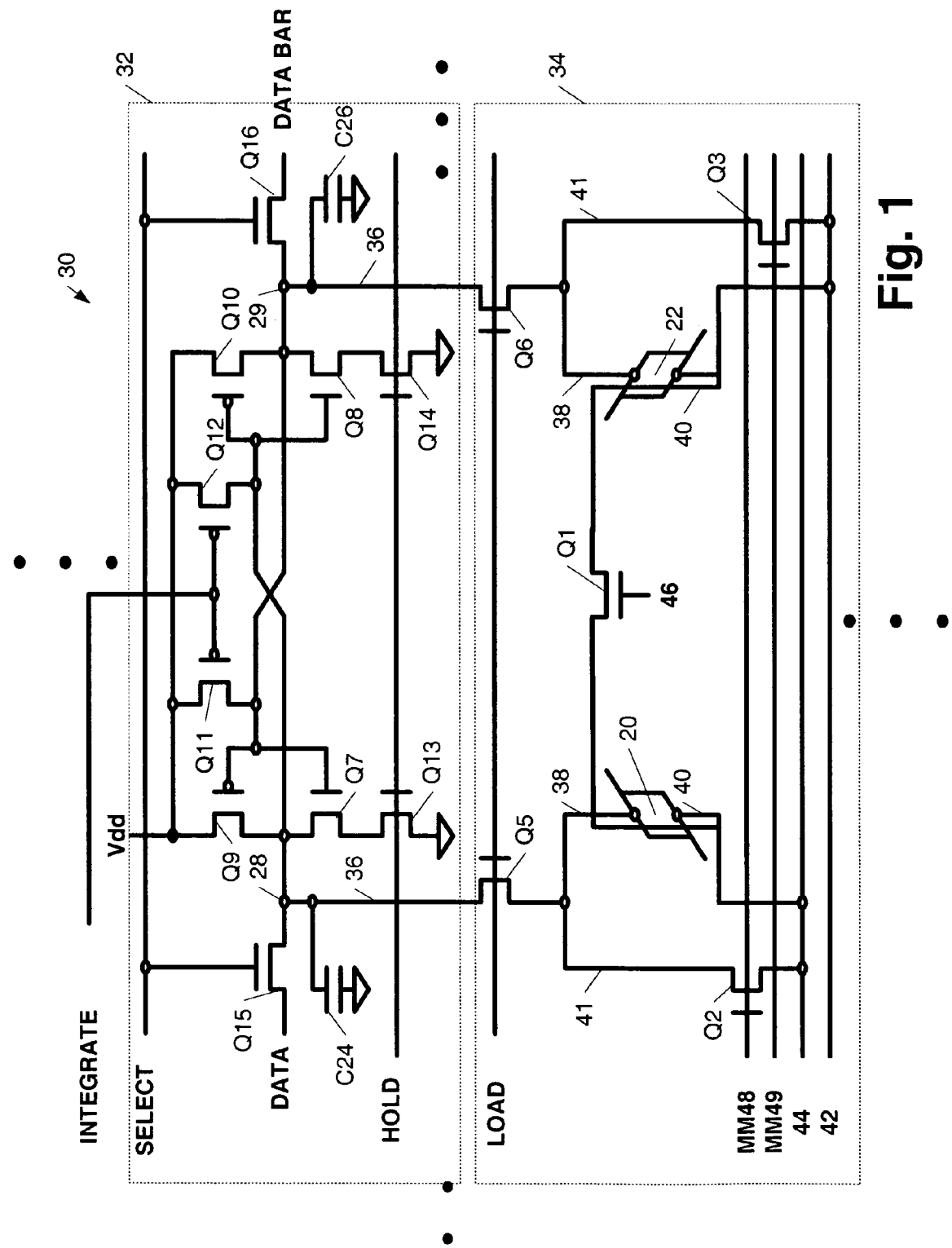
FIG. 1 illustrates an electrical schematic diagram of a latch including magnetic elements.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning to the drawings, an exemplary embodiment of a memory storage circuit or latch is illustrated in FIG. 1. In particular, FIG. 1 illustrates latch 30 comprising volatile portion 32 coupled to nonvolatile portion 34. Volatile portion 32 and nonvolatile portion 34 are outlined by dotted lines to distinguish the collection of components within latch 30 which are configured to store bits solely in the presence of power as well as with and without the presence of power, respectively. The placement of the dotted-line boundaries are arbitrary and, therefore, the size of volatile portion 32 and nonvolatile portion 34 are not restricted to the dotted lines themselves. In addition, the dotted lines are not included as components within latch 30 and, thus, do not serve a function within the latch. Although FIG. 1 illustrates latch 30 having one volatile portion and one nonvolatile portion, latch 30 may include any number of complementary coupled volatile and nonvolatile portions as indicated by the continuation dots arranged along the periphery of latch 30. The aforementioned discussion of dotted lines and continuation dots are applicable to the embodiment of latch 30 illustrated in FIG. 6 as well. In addition, it is noted that the terms "memory storage circuit" and "latch" may be used interchangeably herein.

As shown in FIG. 1, nonvolatile portion 34 may include magnetic elements 20 and 22. In general, magnetic elements 20 and 22 may each include any compilation of layers, including some with magnetic properties, which are collectively configured to store bits in a first logic state or a second logic state. In particular, magnetic elements 20 and 22 may each include materials having magnetic vectors oriented in a parallel fashion or in an anti-parallel fashion, corresponding to a low resistance state and a high resistance state, respectively. For example, magnetic elements 20 and 22 may include magnetic tunnel junctions or giant magnetoresistance junctions. In either case, magnetic elements 20 and 22 may be configured to change their logic states by exposure to magnetic fields induced about the magnetic elements. Consequently, nonvolatile portion 34 may include one or more conductive structures by which to induce a magnetic field about magnetic elements 20 and 22. In particular, nonvolatile portion 34 may include conductive paths 40 arranged adjacent to magnetic elements 20 and 22 as shown in FIG. 1. An exemplary configuration of conductive paths 40 is described in more detail below in reference to FIG. 4.

In some cases, latch 30 may include program transistor Q1 interposed between portions of conductive paths 40 which are respectively arranged adjacent to magnetic elements 20 and 22. In such embodiments, the same current may be used to induce a magnetic field about magnetic elements 20 and 22. In particular, an application of voltage to a gate of program transistor Q1 may enable current flow between portions of conductive paths 40 corresponding to magnetic elements 20 and 22. As shown in FIG. 1, conductive paths 40 may be coupled to current source lines 42 and 44. In an embodiment in which an appropriate amount of voltage is applied to program transistor Q1, either current source line 42 or 44 may be used to supply current through conductive paths 40 and the other of current source lines 42 and 44 may serve as a ground line. In general, the term "program transistor", as used herein, may refer to a transistor coupled to a series of conductive structures used to induce a magnetic field about a magnetic element for setting the magnetic direction of the magnetic element. As such, latch 30 may, in some embodiments, include distinct program transistors coupled to each of conductive paths 40 corresponding to magnetic elements 20 and 22. In such an embodiment, conductive lines 40 may not be coupled to one another, but may lead to ground subsequent to passing through their respective program transistors.

In either case, nonvolatile portion 34 may, in some embodiments, be configured to have magnetic elements 20 and 22 serve as a differential pair of magnetic elements. In particular, nonvolatile portion 34 may be configured such that magnetic elements 20 and 22 may be set in opposing logic states. An exemplary embodiment of nonvolatile portion 34 having such a configuration is described in more detail below in reference to FIG. 4. In other embodiments, nonvolatile portion 34 may be configured to have a a single magnetic element, which may be used in conjunction with a plurality of reference magnetic elements. In general, the plurality of reference magnetic elements may be arranged external to nonvolatile portion 34 and may be used for comparing the logic states of all of the magnetic elements arranged within latch 30. Consequently, in such an embodiment, the loading of data from nonvolatile portion 34 to volatile portion 32, as described in more detail below, may include loading data from the magnetic element within nonvolatile portion 34 and the plurality reference magnetic elements arranged external to the nonvolatile portion. In an embodiment in which magnetic elements 20 and 22 serve as a differential pair of elements, loading data from nonvolatile portion 34 to volatile portion 32 may include loading data from magnetic elements 20 and 22 to nodes 28 and 29, respectively, as described in more detail below.

As shown in FIG. 1, magnetic elements 20 and 22 may be coupled to a plurality of transistors within volatile portion 32. Such a plurality of transistors may be collectively coupled to store bits in both a first logic state and a second logic state. More specifically, transistors Q8–Q14 may be collectively configured to store bits of opposite logic states at nodes 28 and 29. In some cases, latch 30 may be configured to load bits from magnetic elements 20 and 22 into the plurality of transistors within volatile portion 32. In particular, latch 30 may include conductive paths 36 and 38 as well as transistors Q5 and Q6 with which to emulate the opposing logic states of magnetic elements 20 and 22 at nodes 28 and 29, respectively. More specifically, conductive paths 38 may be coupled to transistors Q5 and Q6, which are in turn coupled to conductive paths 36. Conductive paths 36 extend up to nodes 28 and 29 such that upon an application of a bias voltage along LOAD line, transistors Q5 and Q6 may turn on and enable current flow through conductive paths 38.

In general, conductive paths 38 may include a set of structures configured to pass current through magnetic elements 20 and 22. In this manner, data sent to volatile portion 32 may be representative of the logic states (i.e., resistance levels) within magnetic elements 20 and 22. An exemplary configuration of a set of structures for conductive paths 38 is described in more detail below in reference to FIG. 5. In addition, a more detailed description of the sequence of steps for loading bits from magnetic element 20 and 22 to nodes 28 and 29 is provided below in reference to FIGS. 2 and 3. In some embodiments, the plurality of transistors within volatile portion 32 may be loaded from a source other than nonvolatile portion 34, such as DATA and DATABAR lines, for example. In such embodiments, a low voltage application along SELECT line may be used to enable transistors Q15 and Q16 to flow current to the plurality of transistors within volatile portion 32.

In light of the different adaptations of conductive paths 38 and 40 to respectively conduct current through and adjacent to magnetic elements 20 and 22, the lines representing the conductive structures of conductive paths 38 and 40 in FIG. 1 are illustrated in different schematic manners relative to magnetic elements 20 and 22. In particular, the lines representing conductive paths 38 are shown coupled to two opposing sides of magnetic elements 20 and 22. Consequently, the portions of conductive paths 38 traversing through magnetic elements 20 and 22 are not depicted with a line. The lines representing conductive paths 40, on the other hand, are shown extending from current source 42 or 44 to program transistor 28, with the portions adjacent to magnetic elements 20 and 22 shown.

Figure 2:
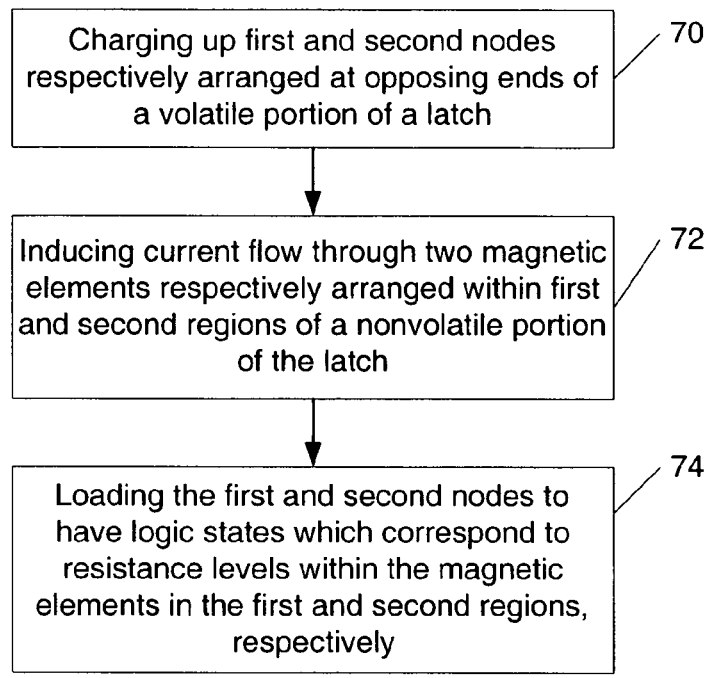
FIG. 2 illustrates a flowchart outlining a method for operating the latch of FIG. 1.
Figure 3:
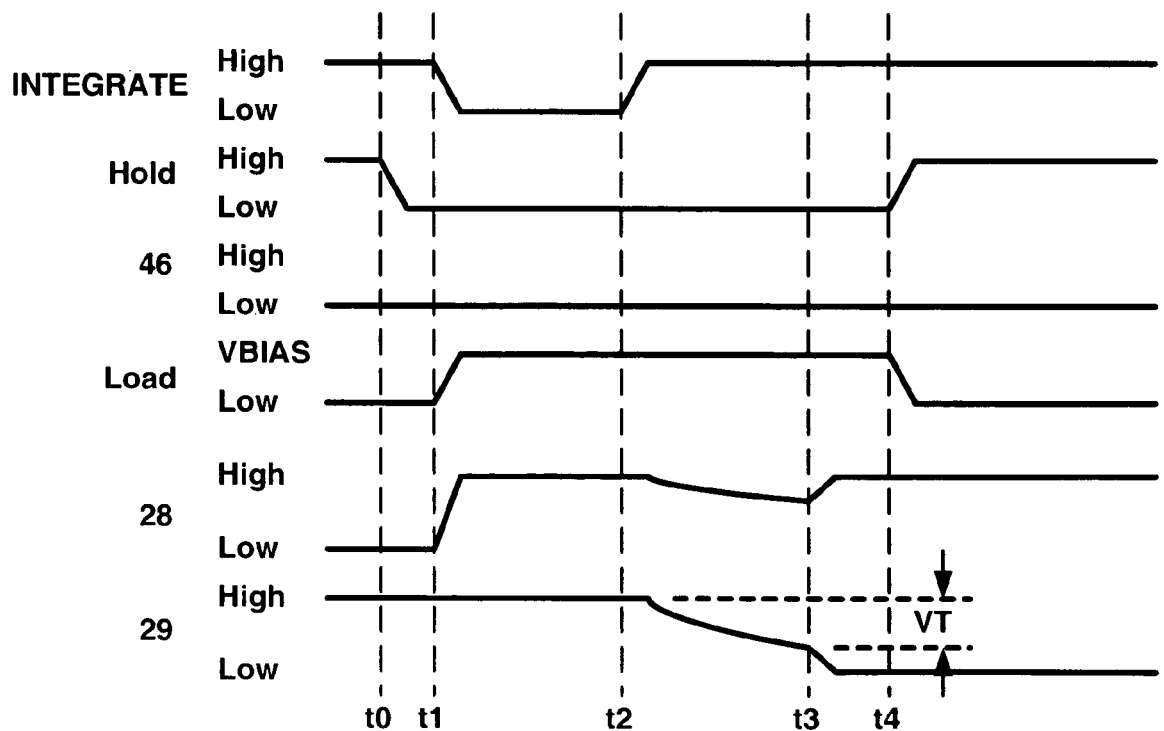
FIG. 3 illustrates a timing chart of voltage applications along different lines and nodes within the latch of FIG. 1 during a load operation.

As noted above, a detailed description of the process of loading data from nonvolatile portion 34 to volatile portion 32 is described in reference to FIGS. 2 and 3. In particular, FIG. 2 illustrates a flow chart outlining such a process and FIG. 3 illustrates a timing chart of the application of voltages along different lines and nodes within latch 30 during the load operation. As shown in FIG. 3, at time t0, a low application of voltage may be applied to HOLD line, releasing data stored within volatile portion 32. At time t1, a low application of voltage may be applied to INTEGRATE line, turning on PMOS transistors Q11 and Q12 to charge up nodes 28 and 29. Such a charging up process is referred to in FIG. 2 as block 70. The loading process further includes block 72 in which current flow is induced through two magnetic elements of a nonvolatile portion of the latch. Such a process is referenced at time t1 in FIG. 3 by increasing the voltage along LOAD line to a bias voltage, which is specifically configured to incur a voltage on the gates of NMOS transistors Q5 and Q6 that limits the amount of voltage applied to magnetic elements 20 and 22. Such a limited voltage may advantageously prevent a breakdown of the tunnel junction within magnetic elements 20 and 22.

In general, the resistance sensed through magnetic elements 20 and 22 may be a function of the bias voltage applied to LOAD line. Variations within magnetic elements, however, may cause a breakdown voltage of a tunneling layer of magnetic element to be low in some embodiments. Low breakdown voltages may, in some cases, cause in load failures, reducing the reliability of the latch. In some embodiments, different voltage levels may be applied along LOAD line to vary the amount of current passing through transistor Q5 during different test operations of latch 30. In this manner, magnetic elements within latch 30 having low breakdown voltages may be detected and discarded, improving the reliability of the device. In addition, varying the application of voltage along LOAD line may allow an optimum bias voltage to be determined for nonvolatile portion 34.

Although FIG. 3 illustrates the timing of bringing INTEGRATE line low (corresponding to charging up nodes 28 and 29) and bringing LOAD line to a bias voltage (corresponding to inducing current flow through magnetic elements 20 and 22), the two processes may alternatively be conducted at different times. In particular, LOAD line may, in some embodiments, be brought to a bias voltage subsequent to decreasing the voltage application along INTEGRATE line. In either case, the bias voltage along LOAD line is preferably applied before an application of voltage along INTEGRATE line is brought high at time t2. Bringing INTEGRATE line high may release the charge at nodes 28 and 29 as noted in FIG. 3 slightly subsequent to time t2. In particular, the voltage levels at nodes 28 and 29 may start to decrease gradually subsequent to time t2 as shown in FIG. 3.

In an embodiment in which magnetic element 20 is in a high resistance state and magnetic element 22 is in a low resistance state, a smaller amount of current through magnetic element 20 will be conducted through magnetic element 22. Consequently, capacitor C26 will be discharged faster than capacitor C24. At a time when the voltage at node 29 reaches a threshold voltage VT of transistor Q9 (e.g., time t3 as noted in FIG. 3), node 28 will be pulled high (i.e., logic state "1") by transistor Q9, regeneratively turning off transistor Q10. In addition, node 29 will be pulled low (i.e., logic state "0") by the current through magnetic element 22. It is noted that rate of discharge of capacitor C24 and C26 will be reversed when magnetic element 20 is in a low resistance state and magnetic element 22 is in a high resistance state. In such an embodiment, node 29 will be pulled high when node 28 reaches a threshold voltage VT of transistor Q10, regeneratively turning off transistor Q9. As a result node 28 will be pulled low by the current through magnetic element 20. In either case, HOLD line may be brought high at time t4, turning on transistors Q13 and Q14 such the data is set within volatile portion 32. At the same time or subsequent to the application of voltage along the gates of Q13 and Q14, LOAD line may be turned low turning off transistors Q5 and Q6 and removing the bias from magnetic elements 20 and 22.

As shown in FIG. 1, latch 30 may be substantially absent of cross-over lines between magnetic elements 20 and 22 and nodes 28 and 29. More specifically, latch 30 may include distinct lines extending between magnetic elements 20 and 22 and nodes 28 and 29 which do not overlap within the topography of the latch. In this manner, the logic states stored within magnetic elements 20 and 22 may be directly loaded into nodes 28 and 29, respectively. In other words, nodes 28 and 29 may be loaded with logic states that respectively correspond to the resistance levels stored within the magnetic elements 20 and 22 as noted in block 74 of FIG. 2. Some conventional latches require data stored within a nonvolatile portion of the latch to be loaded to opposite sides of a volatile portion of the latch, thus, requiring cross-over lines. Such cross-over lines occupy valuable space within a latch. Consequently, the latch described herein may occupy less area within a device than a conventional latch which includes cross-over lines.

Figure 4:
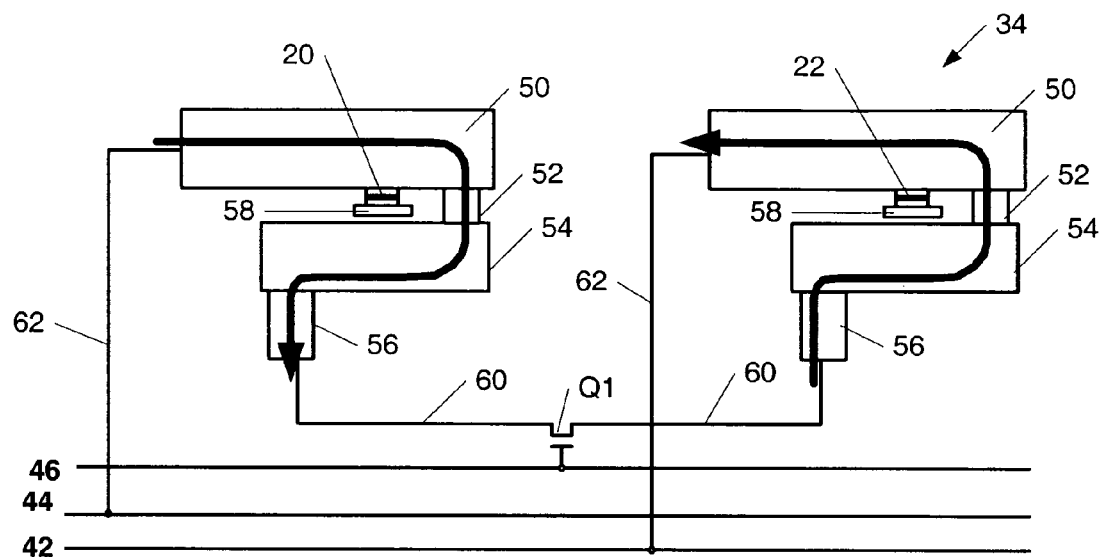
FIG. 4 illustrates an electrical schematic diagram depicting exemplary layouts of structures constituting portions of conductive paths within a nonvolatile portion of the latch of FIG. 1.
Figure 5:
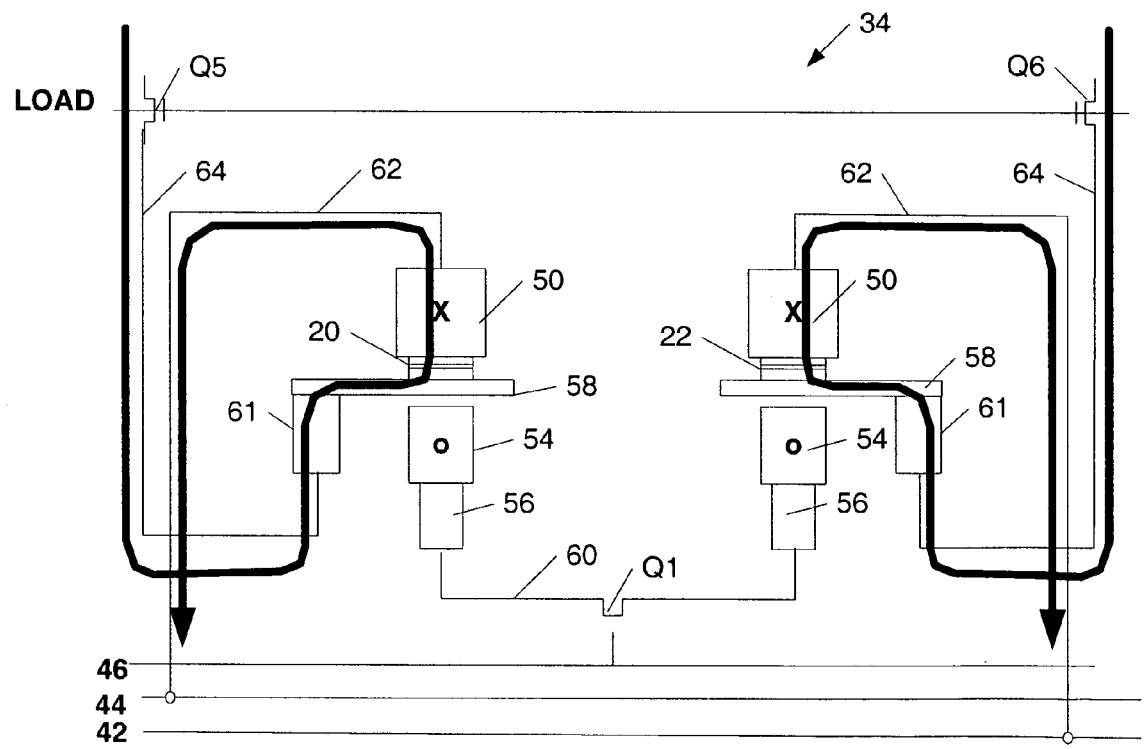
FIG. 5 illustrates an electrical schematic diagram depicting a different cross-sectional view of the layout of structures constituting the portions of conductive paths in FIG. 4.

FIGS. 4 and 5 illustrate an exemplary configuration of conductive structures arranged about magnetic elements 20 and 22 which may constitute conductive paths 38 and 40. In particular, FIGS. 4 and 5 illustrate schematic views of nonvolatile portion 34 depicting exemplary layouts of structures constituting portions of conductive paths 38 and 40. As shown in FIGS. 4 and 5, nonvolatile portion 34 may include conductive structures 50 and 54, vias 52, 56 and 61 and electrodes 58 arranged adjacent to magnetic element 20 and 22. Although FIGS. 4 and 5 illustrate different cross-sectional views for the arrangement of conductive structures 50 and 54, vias 52, 56 and 61, electrodes 58 around magnetic elements 20 and 22, FIGS. 4 and 5 are illustrated as schematic drawings and, therefore, do not relate the position of magnetic elements 20 and 22 with respect to those different cross-sectional views. FIGS. 4 and 5 are merely illustrated to show exemplary configurations conductive paths 38 and 40 as well as exemplary current paths that may be used when programming and loading data from magnetic elements 20 and 22. In addition, it is noted that margin mode circuit lines MM48 and MM49, transistors Q5 and Q6 and conductive lines 41, described in more detail below, are not shown in FIG. 4 or 5 to simplify the drawings. Such components may be included within the embodiments described in reference to FIGS. 4 and 5 or may be omitted from latch 30 in some cases.

The arrangement of conductive structures 50 and 54, vias 52 and 56 and one or more other conductive structures coupled thereto may generally constitute conductive path 40. In particular, conductive structures 50 and 54 may be connected by vias 52 such that a magnetic field may be induced about magnetic elements 20 and 22. In addition, conductive structures 54 may be coupled to vias 56, which are in turn coupled to one or more conductive structures denoted as conductive lines 60 in FIG. 4. In some embodiments, the one or more conductive structures may be coupled to program transistor Q1 as shown in FIG. 4. In other embodiments, the one or more conductive structures may be coupled to ground lines. In either case, conductive paths 40 may include one or more conductive structures interposed between conductive structure 50 and current sources lines 42 and 44, denoted as conductive line 62 in FIG. 4.

The conductive structures along conductive line 62 may also constitute conductive path 38, along with conductive structure 50, magnetic elements 20 and 22, electrodes 58, vias 61 and the other conductive structures coupled to transistors Q5 and Q6, denoted as conductive line 64 in FIG. 5. For such a configuration, conductive structures 50 are preferably arranged in contact with magnetic elements 20 and 22 such that the current may be conducted therethrough. In other embodiments, however, conductive structures 50 may be spaced above magnetic elements 20 and 22 and coupled thereto by vias. In either case, conductive structures 50 may be referred to as bit lines in some embodiments since they are used for the programming and loading operations of latch 30. It is noted that the series of conductive structures constituting conductive paths 38 and 40 may be altered from the illustrations depicted in FIGS. 4 and 5. For example, in some embodiments, conductive structures 50 may be aligned with the lower side of magnetic elements 20 and/or 22 and conductive structures 54 may be aligned with the upper side of magnetic elements 20 and/or 22. In such an embodiment, the arrangement of vias 52 and 56 may be altered such that conductive paths 40 may run under and then above magnetic elements 20 and/or 22 down to one or more program transistors. In addition, electrodes 38 and vias 61 may be arranged above magnetic elements 20 and 22 in such an embodiment.

In any case, conductive structures 50 and 54 may, in some embodiments, be arranged such that conductive path 40 includes two distinct segments arranged adjacent to opposing sides of magnetic elements 20 and 22. Such an arrangement of structures may generally be referred to herein as a "loop around" or "fold back" configuration and is described in more detail below. In yet other embodiments, conductive paths 40 may include a series of conductive structures which do not loop around magnetic elements 20 and 22. In particular, conductive paths 40 may, in some embodiments, include one or more conductive structures arranged along one side of magnetic elements 20 and 22 and may be substantially absent of structures along the opposing side of the magnetic elements. Such a configuration of conductive paths 40 may be referred to herein as a non-fold back configuration.

In some embodiments, nonvolatile portion 34 may include conductive structures which are arranged adjacent to such opposing sides of magnetic elements 20 and 22, but are not included in the series of structure within conductive paths 40. Such additional structures may be spaced apart from magnetic elements 20 and 22. In addition, the additional structures may be oriented to conduct current in a direction which is orthogonal to the direction of current flow through conductive structures 50, thereby providing sets of cross-hatched conductive lines adjacent to magnetic elements 20 and 22. In any case, the magnitude of magnetic fields generated from non-fold back configurations are discussed in more detail below relative to the magnitude of magnetic fields generated from conductive paths with a fold back arrangement. In addition, the voltage requirements for non-fold back configurations are discussed in more detail below relative to fold back arrangements.

As noted above, conductive structures 50 and 54 may be aligned along opposing sides of magnetic elements 20 and 22 to create a fold back or loop around configuration. In some cases, conductive structures 50 and 54 may be aligned parallel to one another as shown in FIG. 4. In other cases, however, conductive structures 50 and 54 may be angled relative to each other. As noted above, conductive structures 50 and 54 may be coupled together by vias 52. Consequently, the direction of current flow within conductive structures 50 and 54 may be different relative to each other and, in some cases, directly opposite from each other. For example, conductive structure 50 adjacent to magnetic element 20 may include direction of current flow to the right, while conductive structure 54 adjacent to magnetic element 20 may include direction of current flow to the left when current flow is induced from 44 to 42. Alternatively, conductive structure 50 may have a direction of current flow to the left and conductive structure 54 may have a direction of current flow to the right when current flow is induced from 42 to 44 around magnetic element 20.

In any case, the configuration of conductive path 40 to fold back or loop around magnetic elements 20 and 22 may advantageously increase the magnetic field induced about the elements. In particular, the arrangement of conductive structures 50 and 54 aligned along opposing sides of magnetic elements 20 and 22 and connected by vias 52 may approximately double the magnetic field induced about the magnetic elements relative to an embodiment in which conductive path 40 is not configured to fold back or loop around magnetic elements 20 and 22. In some cases, the fold back or loop around configuration may offer an even larger magnetic field relative to latches including cross-hatched conductive lines adjacent to magnetic elements 20 and 22. In particular, the magnitude of the magnetic field induced by a fold back or loop around configuration may be approximately 2.8 times larger than a magnetic field induced by a configuration of cross-hatched conductive lines in some embodiments. The calculation of the factor of 2.8 is computed from an embodiment in which the amount of current applied to cross-hatched conductive lines are equal and the same total amount of current is applied to a loop around configuration of conductive paths 40. In some cases, however, the same amount of current may not be applied to cross-hatched conductive lines while programming a latch. As such, the factor used to show the relative magnitudes of magnetic fields generated by a latch with fold back conductive paths versus magnetic fields generated by a latch with cross-hatched conductive lines may be smaller or larger than approximately 2.8 in some embodiments.

In any case, for a given amount of current, the effective current through a conductive path having a fold back configuration may be larger than the effective current generated from a conductive path which does not include a fold back configuration. As a result, the loop around configuration of conductive structures 50 and 54 may, in some embodiments, reduce the amount of current used to operate latch 30 relative to an embodiment in which conductive path 40 does not include a loop around configuration. As noted above, the magnetic field induced from a fold back configuration of conductive structures 50 and 54 is considerably larger than the magnetic field induced by a configuration in which conductive structures 50 and 54 are not arranged to loop around magnetic elements 20 and 22. In addition, the magnetic field induced from a fold back configuration of conductive structures 50 and 54 is considerably larger than the magnetic field induced within a latch having cross-hatched conductive lines adjacent to magnetic elements 20 and 22.

As such, for a given magnitude of a magnetic field needed to program magnetic elements 20 and 22, a smaller amount of current may be used to operate a latch including a fold back configuration of conductive path 40 relative to a latch without such a fold back configuration for conductive path 40. For example, the amount of current used to program nonvolatile portion 34 may be less than approximately 5 mA in embodiments in which conductive path 40 includes a fold back configuration. An amount of current used to program nonvolatile portion 34 having conductive path 40 without a loop around configuration may be approximately 10 mA in some embodiments. In contrast, an amount of total current used to program nonvolatile portion 34 with a configuration of cross-hatched conductive lines may be greater than approximately 15 mA in some embodiments. In any case, the overall power requirements of a latch including magnetic elements may be reduced relative to latches having non-magnetic elements with which to store bits in a nonvolatile portion.

FIG. 4 illustrates an exemplary configuration of programming magnetic elements 20 and 22 by applying a high voltage level to current source lines 44 and 46 as well as applying a low voltage current level to current source line 42. Such an application of voltages may render current to be conducted through the conductive path around magnetic element 20 to the conductive path around magnetic element 22 as shown by the boldface arrows through conductive structures 50 and 54 and vias 52 and 56. In other embodiments, a low voltage level may be applied to current source line 44 high and a high current voltage level may be applied to current source lines 42 and 46 to conduct current in the reverse direction through magnetic elements 20 and 22. In either case, applying a voltage to the gate of program transistor Q1 allows same current to flow through both of magnetic elements 20 and 22. In yet other cases, conductive paths 40 may not be joined by program transistor Q1 and conductive paths 40 may include distinct lines arranged adjacent to magnetic elements 20 and 22. In such an embodiments, a high level voltage may be applied to current source lines 42 and 44 in order to induce a magnetic field about magnetic elements 20 and 22, respectively.

As noted above, magnetic elements 20 and 22 may, in some cases, be configured as a differential pair of magnetic elements such that opposing logic states are stored within the elements. Consequently, conductive paths 40 may be configured to pass current in different directions about magnetic elements 20 and 22 in some embodiments. In particular, conductive paths 40 may be configured to pass current through conductive segment 50, via 52, conductive segment 54 and via 56 around magnetic element 20 and a reverse of such a sequence of structures around magnetic element 22 as illustrated in FIG. 4. Since the direction of current through conductive structures 50 and 54 adjacent to magnetic element 20 is opposite of the direction of current through conductive structures 50 and 54 adjacent to magnetic element 22, the magnetic vectors within the magnetic elements will be oriented in different states, namely parallel or anti-parallel. Other conductive routes for conductive paths 40 may be used to program magnetic elements 20 and 22 in opposing logic states as well. For example, in some cases, conductive paths 40 may be configured to pass current through conductive segment 50 adjacent to magnetic element 22 directly subsequent to passing around magnetic element 20 and through program transistor Q1. In such an embodiments, the conductive path may be further configured to continue the current flow to via 52, conductive segment 54 and via 56 around magnetic element 22. In such a case, via 52 may be arranged to the left of magnetic element 22 with respect to the perspective illustrated in FIG. 4. In addition, via 56 may be spaced below and to the right of magnetic element 22.

FIG. 5 illustrates an exemplary configuration of loading data from magnetic elements 20 and 22. As noted above, a bias voltage may be applied to LOAD line during a loading operation of latch 30. Such an application of a bias voltage may activate transistors Q5 and Q6 to enable current flow from nodes 28 and 29 of volatile portion 32 to magnetic elements 20 and 22 in nonvolatile portion 34 as described above in reference to FIGS. 2 and 3. In some embodiments, conductive paths 38 may be run to a designated ground line within latch 30. In other embodiments, however, conductive paths 38 may be configured to run such a current flow to current source lines 42 and 44 as shown in FIG. 5. In such an embodiment, current source lines 42 and 44 may serve as virtual ground lines during a loading operation of latch 30. The use of current source lines 42 and 44 as ground lines may advantageously eliminate the needs to incorporate a ground line specified for such a use in latch 30. In addition, the need to have transistors configured to induce current flow to such a designated ground line may be eliminated. Consequently, the circuitry of latch 30 may be simplified and the amount of area it occupies may be reduced relative to embodiments in which a designated ground line and transistors are included.

In addition or alternatively, conductive paths 38 may, in some embodiments, be configured to induce current flow in a sequence from transistors Q5 and Q6 to vias 61, electrodes 58, magnetic elements 20 and 22, and conductive structures 50 and current sources lines 42 and 44 as shown by the boldface arrows following conductive paths 38 in FIG. 5. Such a configuration of conductive paths 38 may be particularly advantageous in embodiments in which current source lines 42 and 44 are commonly coupled to a plurality of magnetic elements comprising different nonvolatile portions within latch 30. In particular, in embodiments in which current source lines 42 and 44 are shared, the configuration of conductive paths 38 to route current flow to via 61 through conductive structure 50 may advantageously prevent nodes of different volatile portions corresponding to the different nonvolatile portions of latch 30 from shorting together. For example, in an embodiment in which current source line 44 is coupled to magnetic element 20 as well as another magnetic element arranged in an adjacent nonvolatile portion of latch 30, the configuration of conductive paths 38 may prevent nodes of different volatile portions coupled to such magnetic elements from shorting.

Returning to FIG. 1, latch 30 may, in some embodiments, include circuitry which is configured to alter the amount of current through conductive paths 38 during a load operation of the latch. In particular, latch 30 may, in some embodiments, include conductive paths 41, transistors Q2 and Q3 and margin mode lines MM48 and MM49. As shown in FIG. 1, an application of voltage along margin mode lines MM48 and/or MM49 may enable transistors Q2 and/or Q3 to conduct current from conductive path 36 during a load operation of latch 30. The conduction of current through conductive paths 41 relative to magnetic elements 20 and 22 may increase the amount of current passing through transistors Q5 and Q6, respectively. Consequently, the resistance of magnetic elements 20 and/or 22 may be effectively reduced depending on whether transistors Q2 or Q3 are turned on. In general, it is beneficial to have the difference of resistances between magnetic elements in opposing states to be large enough to enable volatile portion 32 to be consistently loaded with the correct data. However, variations within magnetic elements may cause the differences in resistance between magnetic elements to be reduced to a level at which correct data may not be reliably loaded into volatile portion 32. In some cases, the difference in resistances may be reduced to a level at which data may be correctly loaded during some operations of the device, but may fail to load correct data at other times. Such a scenario may be particularly undesirable in cases in which a nonvolatile latch passes a test operation, but fails in production operations.

Incorporating circuitry (e.g., conductive paths 41, transistors Q2 and Q3 and margin mode lines MM48 and MM49) to alter the amount of current through conductive paths 38 during a load operation of latch 30 may advantageously provide a manner with which to detect magnetic elements which may produce low differential resistances. In particular, conductive paths 41, transistors Q2 and Q3 and margin mode lines MM48 and MM49 may be used to decrease the resistance through magnetic elements 20 and 22 such that latch 30 may be tested for loading data with reduced differential resistances. In cases in which latch 30 correctly loads data into volatile portion 32 at such reduced differential resistances, the reliability of latch 30 may be more certain than in cases in which the resistances through magnetic elements 20 and 22 are not reduced. Consequently, it may be advantageous to employ margin mode circuit lines MM48 and MM49, transistors Q5 and Q6 and conductive lines 41 within latch 30 in some cases. In other embodiments, however, margin mode circuit lines MM48 and MM49, transistors Q5 and Q6 and conductive lines 41 may be omitted from latch 30 to ease the complexity of the device.

Figure 6:
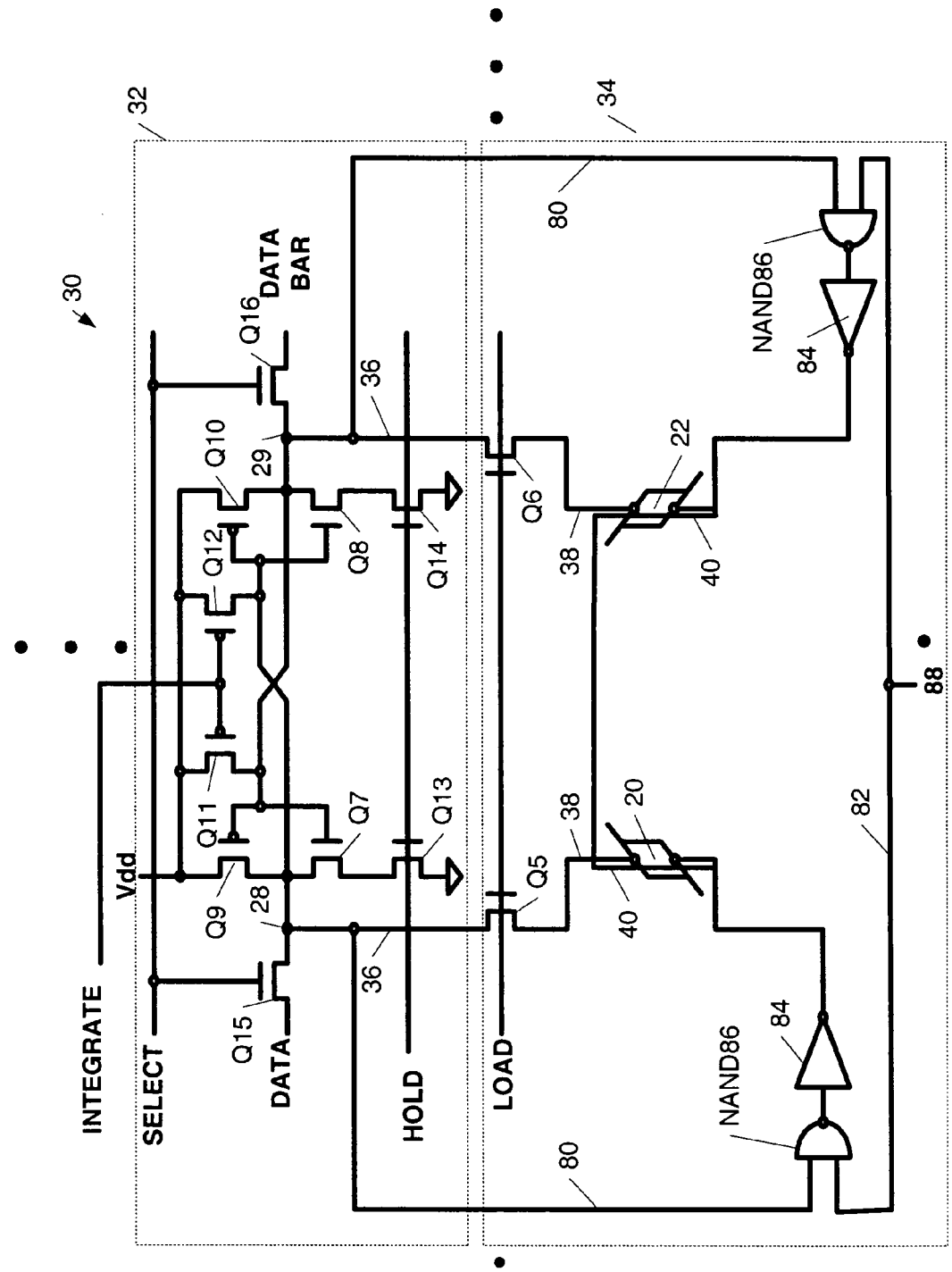
FIG. 6 illustrates an electrical schematic diagram of the latch in FIG. 1 comprising a different arrangement of circuitry.

Although latch 30 is discussed above in reference to loading data from magnetic elements 20 and 22 to nodes 28 and 29 within volatile portion 32, latch 30 may alternatively be configured to program magnetic elements 20 and 22 from data stored within volatile portion 32. An exemplary embodiment of latch 30 illustrating such a configuration is shown in FIG. 6. In particular, FIG. 6 illustrates latch 30 absent of current sources lines 42 and 44 and instead includes conductive lines 80, write enable line 82, NAND gates 86 and current drivers 84. It is noted that margin mode circuit lines MM48 and MM49, transistors Q5 and Q6 and conductive lines 41 are not shown in FIG. 6 to simplify the drawing. Such components may be included within such an embodiment of latch 30 or may be omitted from latch 30 as in the embodiment of FIG. 1.

As shown in FIG. 6, conductive lines 80 may be coupled between conductive lines 36 and NAND gates 86. In addition, write enable line 82 may be coupled to NAND gates 86 having voltage source 88. During programming, voltage applied on LOAD line may be low, turning off transistors Q5 and Q6 and floating one side of magnetic elements 20 and 22 so the elements will not be susceptible to voltage stress and breakdown. When voltage source 88 goes high, magnetic elements 20 and 22 may be programmed with current through one of current drivers 84 based on the level of voltage on nodes 28 and 29 of volatile portion 32. Such a latch configuration may be used to load from magnetic elements 20 and 22 to volatile portion 32 as well. In particular, a load operation may include bringing LOAD line high such that transistors Q5 and Q6 allow current flow to be induced through conductive paths 38. In such embodiments, voltage source 88 may be brought low such that the output nodes of current drivers 84 may serve as a virtual ground for current passing through conductive paths 38.

It will be appreciated to those skilled in the art having the benefit of this disclosure that this invention is believed to provide a nonvolatile latch including magnetic elements. Further modifications and alternative embodiments of various aspects of the invention will be apparent to those skilled in the art in view of this description. For example, the designation of transistors as PMOS or NMOS transistors and, thus, the applications of high and low levels of voltages to operate the latch described herein may be reversed for some or all of the transistors within the latch. It is intended that the following claims be interpreted to embrace all such modifications and changes and, accordingly, the specification and drawings are to be regarded in an illustrative rather than a restrictive sense.

What is claimed is:

1. A memory storage circuit, comprising:
   a plurality of magnetic elements each configured to store bits in a first logic state or a second logic state;
   a plurality of transistors coupled to at least two of the magnetic elements, wherein the plurality of transistors are collectively configured to store bits in the first and second logic states;
   a first set of circuitry configured to load bits from a set of the magnetic elements into the plurality of transistors, wherein the first set of circuitry comprises a first set of conductive structures configured to pass current through the set of magnetic elements; and
   a second set of circuitry configured to program the set of magnetic elements, wherein the second set of circuitry comprises;
      a second set of conductive structures configured to induce respective magnetic fields about each of the set of magnetic elements; and
      a program transistor coupled between the set of magnetic elements and configured to enable current flow among the second set of conductive structures.

2. The memory storage circuit of claim 1, wherein the circuitry is substantially absent of cross-over lines.

3. The memory storage circuit of claim 1, wherein the first set of conductive structures comprises a bit line and an electrode coupled to opposing sides of each of the set of magnetic elements, and wherein the circuitry is configured to induce current flow through each of the magnetic elements in a direction from the electrode to the bit line.

4. The memory storage circuit of claim 1, wherein the second set of conductive structures comprises a first series of connected conductive structures comprising at least two elements respectively aligned with opposing sides of one of set of magnetic elements.

5. The memory storage circuit of claim 4, wherein the second set of conductive structures further comprises a second series of connected conductive structures comprising at least two elements respectively aligned with opposing sides of the other of the set of magnetic elements, and wherein the first and second series of connected conductive structures are arranged such that the first and second logic states may be programmed into the set of magnetic elements, respectively.

6. The memory storage circuit of claim 1, further comprising a subcircuit configured to alter current applications along at least one of the first and second sets of conductive structures.

7. The memory storage circuit of claim 1, wherein the set of magnetic elements comprises a differential pair of magnetic elements.

8. The memory storage circuit of claim 1, wherein the set of magnetic elements comprises a selected magnetic element and a plurality of reference magnetic elements.

9. The memory storage circuit of claim 1, wherein the set of magnetic elements are coupled to a common program current source.

10. A circuit, comprising:
    a pair of magnetic elements respectively configured to store bits of opposing logic states, wherein each of the a-magnetic elements is interposed between a respective bit line and a respective electrode;
    a plurality of transistors coupled to the pair of magnetic elements which are collectively configured to store bits of opposing logic states;
    a first node interposed between the plurality of transistors and a respective electrode of one of the pair of magnetic elements;
    a second node interposed between the plurality of transistors and a respective electrode of the other of the pair of magnetic elements; and
    a first set of circuitry configured to load bits from the pair of magnetic elements to the plurality of transistors by inducing current flow through each of the pair of magnetic elements in a direction from their respective electrodes to their respective bit lines.

11. The circuit of claim 10, further comprising a second set of circuitry configured to load data from the plurality of transistors to the magnetic element.

12. The circuit of claim 10, further comprising a second set of circuitry configured to program the pair of magnetic elements, wherein the second set of circuitry comprises:
    a first series of connected conductive structures comprising at least two elements respectively aligned with opposing sides of one of the pair of magnetic elements and collectively configured to induce a magnetic field sufficient to program the one magnetic element;
    a second series of connected conductive structures comprising at least two elements respectively aligned with opposing sides of another of the pair of magnetic elements and collectively configured to induce a magnetic field sufficient to program the other magnetic element; and
    a program transistor configured to enable current flow between the first and second series of connected conductive structures such that the one and other magnetic elements are programmed in opposing logic states.

13. A method for operating a latch, comprising:
    charging up first and second nodes of a volatile portion of the latch, wherein the first and second nodes are respectively arranged at opposing ends of the volatile portion;
    inducing current flow through two magnetic elements respectively arranged within first and second regions of a non-volatile portion of the latch, wherein the first and second regions are respectively arranged in alignment with the opposing ends of the volatile portion, and wherein the current flow is directed from electrodes respectively arranged adjacent to the two magnetic elements to bit lines respectively arranged on sides of the two magnetic elements opposing the electrodes; and
    loading the first and second nodes to have logic states which correspond to resistance levels within the magnetic elements in the first and second regions, respectively.

14. The method of claim 13, wherein the step of loading comprises discharging the first and second nodes at different rates.

15. The method of claim 13, wherein the step of loading comprises discharging the first and second nodes until the second node reaches a threshold voltage of a transistor coupled thereto such that the second node is pulled low and the first node is pulled high.

* * * * *

UNITED STATES PATENT AND TRADEMARK OFFICE
CERTIFICATE OF CORRECTION

PATENT NO. : 7,082,053 B1 Page 1 of 1
APPLICATION NO. : 10/745725
DATED : July 25, 2006
INVENTOR(S) : Jenne et al.

It is certified that error appears in the above-identified patent and that said Letters Patent is hereby corrected as shown below:

IN THE CLAIMS:

Col. 14, line 13: Please delete "a-magnetic" and substitute --magnetic--.

Signed and Sealed this

Seventeenth Day of April, 2007

JON W. DUDAS
*Director of the United States Patent and Trademark Office*